United States Patent [19]

Martin

[11] Patent Number: 4,719,375
[45] Date of Patent: Jan. 12, 1988

[54] HIGH RESOLUTION DIGITAL DELAY TIMER

[75] Inventor: Albert D. Martin, Los Alamos, N. Mex.

[73] Assignee: The United States of America as represented by the United States Department of Energy, Washington, D.C.

[21] Appl. No.: 861,380

[22] Filed: May 9, 1986

[51] Int. Cl.[4] .................. H03K 17/28; H03K 17/296
[52] U.S. Cl. ..................... 307/600; 307/269;
307/606; 328/56; 328/63; 328/130.1; 377/20
[58] Field of Search ............... 307/600, 601, 603, 606,
307/608, 269; 328/55, 56, 63, 129.1, 130.1;
368/120, 118

[56] References Cited

U.S. PATENT DOCUMENTS

| 4,516,861 | 5/1985 | Frew et al. | 328/55 |
| 4,564,953 | 1/1983 | Werking et al. | 328/63 |
| 4,631,484 | 12/1986 | Malka et al. | 328/55 |

*Primary Examiner*—Stanley D. Miller
*Assistant Examiner*—Tai V. Duong
*Attorney, Agent, or Firm*—Ray G. Wilson; Judson R. Hightower

[57] ABSTRACT

Method and apparatus are provided for generating an output pulse following a trigger pulse at a time delay interval preset with a resolution which is high relative to a low resolution available from supplied clock pulses. A first lumped constant delay (20) provides a first output signal (24) at predetermined interpolation intervals corresponding to the desired high resolution time interval. Latching circuits (26, 28) latch the high resolution data (24) to form a first synchronizing data set (60). A selected time interval has been preset to internal counters (142, 146, 154) and corrected for circuit propagation delay times having the same order of magnitude as the desired high resolution. Internal system clock pulses (32, 34) count down the counters to generate an internal pulse delayed by an interval which is functionally related to the preset time interval. A second LCD (184) corrects the internal signal with the high resolution time delay. A second internal pulse is then applied to a third LCD (74) to generate a second set of synchronizing data (76) which is complementary with the first set of synchronizing data (60) for presentation to logic circuits (64). The logic circuits (64) further delay the internal output signal (72) to obtain a proper phase relationship of an output signal (80) with the internal pulses (32, 34). The final delayed output signal (80) thereafter enables the output pulse generator (82) to produce the desired output pulse (84) at the preset time delay interval following input of the trigger pulse (10, 12).

14 Claims, 6 Drawing Figures

HIGH RESOLUTION DIGITAL DELAY TIMER

This invention is the result of a contract with the Department of Energy (Contract No. W-7405-ENG-36).

BACKGROUND OF THE INVENTION

This invention relates to a method and apparatus for generating an output signal at a preselected time following an input signal. More particularly, the invention relates to a method and apparatus for processing digital signals to generate an output pulse at a predetermined time following the arrival of an input pulse with a time interval delay having a resolution greater than obtainable through direct internal digital clock pulses.

There are numerous applications where it is desired to generate an output signal at a known interval following an external trigger signal. Delayed output signals might be used to initiate measurements arising fron an external event at preselected times following the external event. In another example, precise time lapse photography may be obtained.

Conventional delay pulse generators which are reliable, rugged, and relatively simple stand alone devices do not have an adequate resolution and are typically limited to a resolution of greater than 10 ns from an internal clock frequency of less than 100 MHz. It will be appreciated that circuits operating reliably at 100 MHz are not routinely available from manufacturing lots of electronic components and such circuit components must be individually tested and selected to obtain an acceptable degree of reliability and accuracy.

Reliable circuit operation can be improved by supplying a relatively low frequency pulse train for clocking the operation of digital circuit components. Then, some means are required to interpolate the internal pulse width to improve the resolution. In some instances this interpolation is done using analog techniques, which are subject to conventional output errors from component aging, environmental conditions, and manufacturing tolerances. Other commercial devices use ancillary computers and/or microprocessors to interpolate within a basic internal pulse width. These techniques greatly increase the complexity and cost of a delay timer and decrease its reliability and portability.

It is an object of the present invention to obtain a digital delay unit having a timing resolution less than 10 ns.

Yet another objective of the present invention is to obtain a digital delay unit using components commercially available from manufacturing lots.

One other objective is to obtain a stand alone digital delay unit which is rugged and portable, yet has an output which is presettable with a high resolution.

The problems in the prior art and the above objectives are addressed by the present invention, however, and an improved method and apparatus are provided for digital processing to form an output pulse delayed from an input pulse.

SUMMARY OF THE INVENTION

To achieve the foregoing and other objects, and in accordance with the purposes of the present invention, as embodied and broadly described herein, the apparatus of this invention may comprise a high resolution delay timer for generating an output pulse following a trigger pulse at a time delay interval preset with a resolution which is high relative to a low resolution available from supplied clock pulses. A first lumped constant delay (LCD) provides a first output signal at predetermined interpolation intervals corresponding to the desired high resolution within a pulse period of the supplied clock pulse following input of the trigger pulse. A latching circuit latches the first output signal in response to an edge of the supplied clock pulse to form first high resolution synchronizing delay data. The delay timer includes input means for presetting a time delay interval with the desired high resolution within which an output pulse is to be generated following an input trigger pulse. A timer circuit counts the supplied clock pulses and generates an internal pulse which is temporally related to the preset time interval. An internal counter provides for initial timing to a relatively low resolution and a second LCD provides the relatively high resolution delay increment. A circuit responsive to the internal pulse initiates generation of second high resolution synchronizing delay data. Thereafter, a logic circuit receives the first and the second synchronizing delay data to derive the required output pulse which is delayed from the trigger pulse by the preset high resolution time delay interval.

In yet another embodiment of the present invention a method is provided for generating an output pulse with a temporal delay from a trigger pulse following an interval which is preset to a high resolution relative to a low resolution which is available from supplied clock pulses. A first output signal is provided at predetermined interpolation intervals output from a first LCD corresponding to the desired high resolution within a pulse interval of the supplied clock pulses following input of the trigger pulse. The first output signal is latched when an arriving edge of the supplied clock pulse is detected following the trigger pulse to form first high resolution synchronizing delay data. A time delay interval is preset with the desired high resolution for generating an output pulse following the trigger pulse. Thereafter, an internal pulse is generated in temporal relationship to the preset time interval for generating the delayed output pulse. The internal pulse delay interval has a relatively low resolution timing delay from a counter clocked by the supplied clock pulses and a relatively high resolution timing delay from a second LCD. Second high resolution synchronizing delay data is generated in response to the internal pulse. The first and second synchronizing delay data are input to logic circuit means and an output pulse is derived at a time interval delayed from the trigger pulse by the preset high resolution time delay interval.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate the embodiment of the present invention and, together with the description, serve to explain the principles of the invention. In the drawings.

DETAILED DESCRIPTION OF THE DRAWINGS

Figure 1:
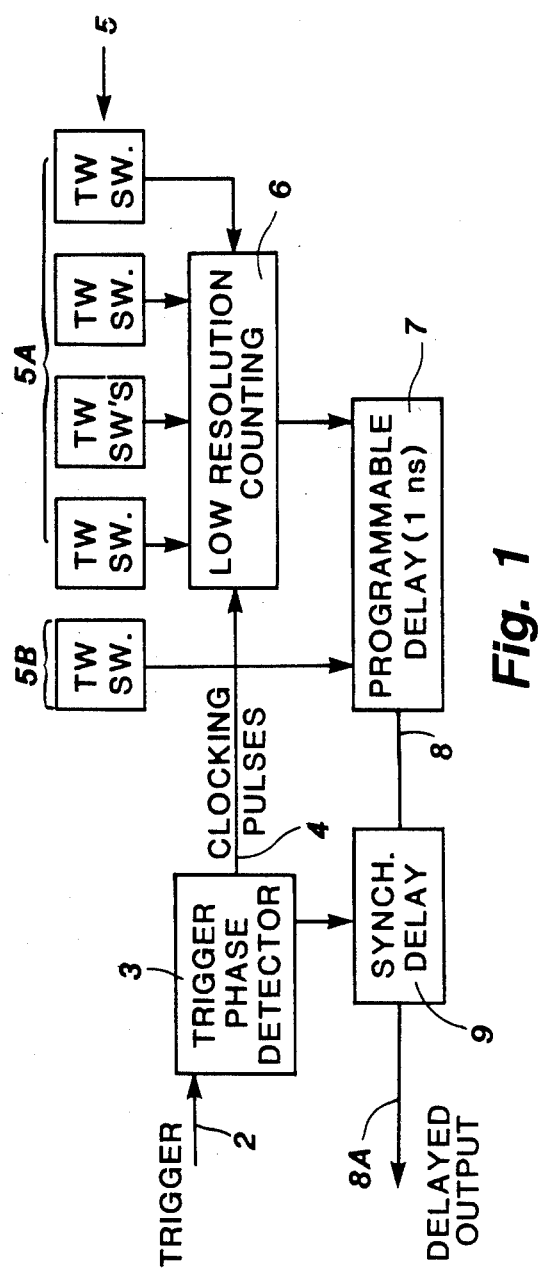
FIG. 1 is a basic block diagram showing one embodiment of the funcitonal relationship of the present invention.

Referring first to FIG. 1, there is shown in block diagram form, one embodiment of the present invention. FIG. 1 shows basic functional relationships of the present method and apparatus and basic data flow within the system. A trigger pulse 2, which may be generated by an external event or from a master signal, is supplied to trigger phase detector 3 for determining the temporal relationship between trigger pulse 2 and clocking pulses 4, which may be internally generated or supplied from an external source.

Clocking pulses 4 generally have a frequency compatible with the response characteristic of circuit components which are commercially available in manufacturing lots and which do not have to be specially tested and selected. As herein illustrated, clocking pulses 4 have a frequency of 50 MHz with a corresponding total pulse width of 20 ns. The selected clocking rate is generally the highest clocking rate for use with commercially available components, but should not be construed as a limitation on the present invention.

In one embodiment a plurality of switches 5 are preset to the desired time interval. Switches 5 may be conventional thumb wheel switches or may be registers into which computer data is loaded. In either event, switches 5 have a switch section 5A for relatively low resolution data and a switch section 5B for high resolution switch data. Low resolution switches 5A are latched into low resolution counting means 6 which are clocked by clocking pulses 4. High resolution data in switch 5B are input to programmable delay 7, which may be a (LCD) having output taps with the selected high resolution. LCDs are commercially available with output taps representing intervals of 1 ns, or having an interpolating resolution corresponding to operation at 1 GHz ($1 \times 10^9$ cps). Programmable delay 7 introduces a high resolution delay component to the output from low resolution counting means 6 to generate a delayed output pulse 8.

Output pulse 8 is generated in synchronism with clocking pulses 4 and the delay interval must be further corrected in synchronism with trigger pulse 2. Output data from trigger phase detector 3 are provided to synchronizing delay 9. Programmable delay 9 also has unsynchronized delayed output 8 as an input. The output from trigger phase detector 3 and unsynchronized delayed output 8 may conveniently be complemented and compared in programmable delay 9 to derive output pulse 8A which is delayed from trigger pulse 2 by the delay increment preset in switches 5 and at the same relative timing with clocking pulses 4 as trigger pulse 2.

Figure 2:
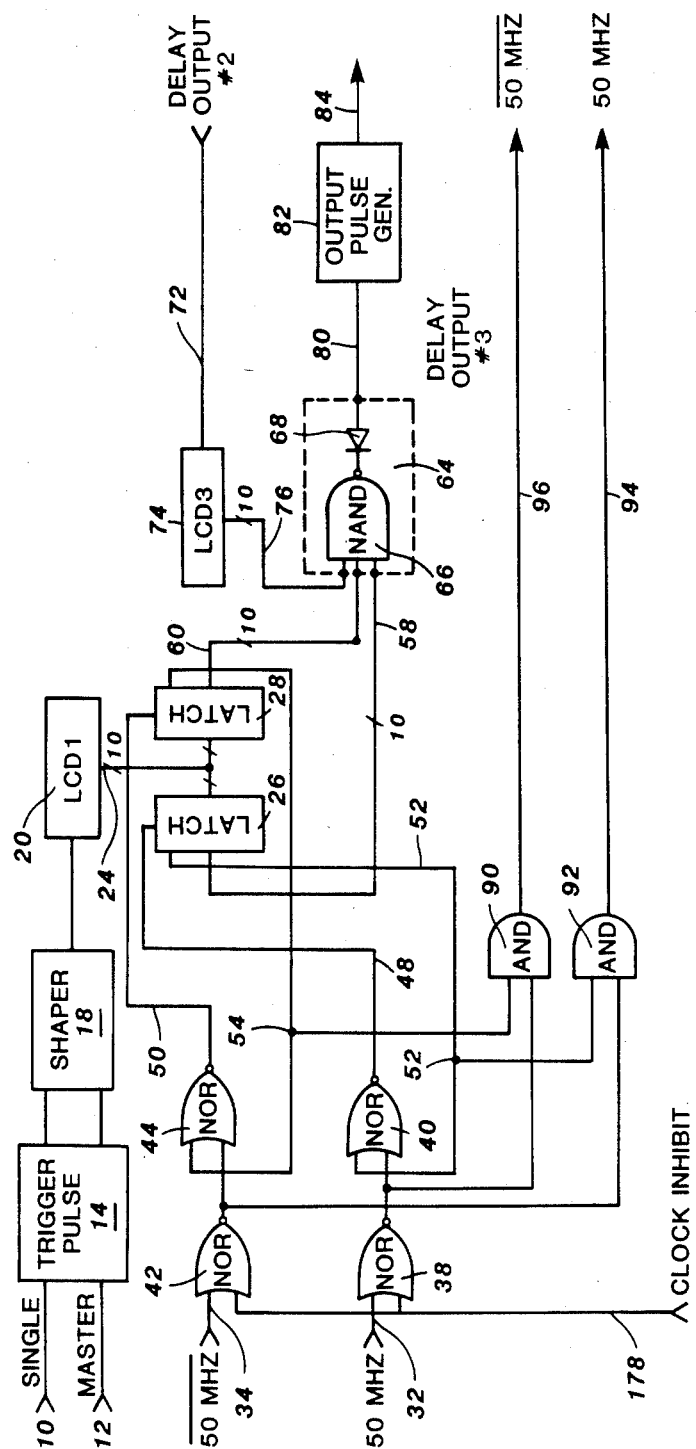
FIG. 2 is a functional schematic of one embodiment for pulse synchronizing and output pulse generation according to one embodiment of the present invention.

Referring now to FIG. 2, there is shown a more detailed schematic diagram of components forming trigger phase detector 3 and synchronizing delay 9 of FIG. 1. Signal 10 representing a single event, or master signal 12 for driving a sequence of delayed outputs, is supplied to trigger pulse initiator 14. An output signal from trigger pulse initiator 14 biases pulse shaper 18 to a turned-on condition. Pulse shaper 18 initiates propagation of a pulse through a first LCD 20. As herein illustrated, ten output taps are provided from LCD 20 having 1 ns increments between tap outputs.

High resolution synchronizing data 24 are supplied to parallel latches 26 and 28. A clocking pulse train, which may be internally generated or supplied by a selected external clock source, is used to provide basic system internal timing. A clocking frequency of 50 MHz is input to the system wherein each positive going pulse width is 10 ns corresponding to the total time span of the output taps of LCD 20.

As shown in FIG. 2, clock signal pulses 32 may be supplied at 50 MHz and also inverted to form complementary clock signal 34. Logic gates 38, 40, 42, 44, which may conveniently be NOR gates, combine clock signal 32 and complementary clock signal 34 to obtain rising clock edges at 10 ns intervals as latching pulses 48 and 50 to latches 26 and 28, respectively. It will be appreciated that latching pulses 48 and 50 are supplied to latches 26 and 28 at 10 ns intervals to alternately latch data within latches 26 and 28.

The occurrence of a latching pulse 48 or 50 latches data within latches 26 and 28 defining the time interval between trigger pulse 10 or 12 and a leading edge of a clock pulse signal 32 or 34 with the desired high resolution. As hereafter explained, any output pulse must be generated with the same temporal relationship to the clock pulses 32 or 34 as trigger pulse 10 to maintain the desired high resolution. Latch outputs 58 and 60 are provided to a corresponding plurality of gates 64, where each gate comprises NAND gate 66 and turn-on diode 68.

Another set of inputs to gates 64 is output data from a third LCD 74. LCD 74 receives a delayed output pulse from circuitry hereinafter described for FIGS. 3 and 6, and provides output data 76 complementary with output data 58 and 60. Thus, the logic of one of gates 64 is satisfied at a time delay having the same relative synchronization with a clock pulse 32 or 34 as a trigger pulse 10 or 12. With the logic satisfied, corresponding diode 68 conducts and a third delayed output signal 80 is obtained. Output pulse generator 82, which is relatively high powered compared with conventional digital circuitry. is responsive to output pulse 80 and generates final output pulse 84, which may be a 30 V pulse for use as a conventional timing output pulse.

As explained above, clock pulses 32 and 34 form leading edges at a rate corresponding to 100 MHz and data is latched within latches 26 and 28 at 10 ns intervals. It is desired to commence counting operations in the remainder of the circuit at a next leading edge following the latching event, i.e., within 10 ns of the latching event. AND gates 90 and 92 have a logical output upon concurrence of a latching event with arrival of a next clocking pulse to output counter clocking pulse train 94 and complementary counter clocking pulse train 96 commencing with the next positive going pulse edge. Pulse trains 94 and 96 are used to count down data storage counters, as hereinafter explained, to generate precursor delayed output signals.

FIG. 2 further depicts the application of clock inhibit pulse 178 to gates 38 and 42. Clock inhibit pulse 178 prevents further transmission of clocking pulses 32 and 34 when the relatively low resolution counters are empty, as hereinafter explained.

Figure 3:
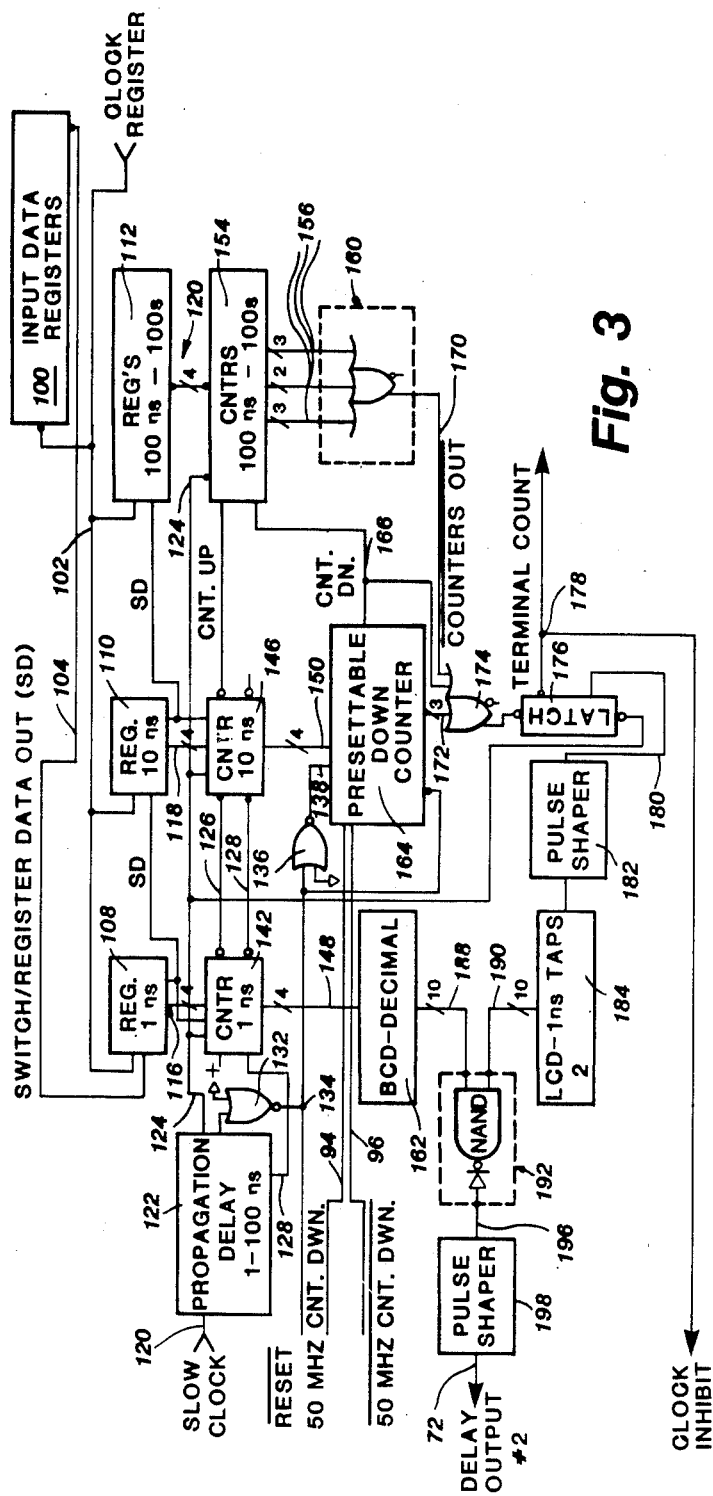
FIG. 3 is a functional schematic of circuitry in block diagram for generating an internal pulse delayed from the trigger pulse by a time interval having the desired high resolution.

In FIG. 3 there is shown in block diagram schematic form an apparatus for generating an internal pulse delayed from the trigger pulse by an interval having the desired high resolution. Input data registers 100 are provided to preset the desired delay interval with the high resolution provided herein. Input data registers 100 may be manual thumb wheel switches or may be data registers set by an external computer. When the data registers 100 have been set, switch/register data (SD) 104 may be clocked from data registers 100 by clock pulses 102. SD output 104 is clocked to registers 108, 110, and 112 for further use within the delay system. Register 108 is provided with high resolution timing data (e.g., to 1 ns), register 110 with intermediate resolution timing data (e.g., 10 ns) and register 112 with low resolution timing data. Register 112 may comprise a plurality of registers functionally related to a maximum time interval to be obtained (e.g., 100 ns up to 100 s).

It should be appreciated that conventional components introduce signal processing delays internally of the apparatus. With low resolution systems these operating delays are relatively insignificant. With the high resolution system described herein, the processing delays are significant and must be accommodated in generating the output pulse with the desired high resolution time delay. Accordingly, circuit 122 is provided to account for propagation delay. With the arrival of an auxiliary, or slow, clock pulse 120, propagation correcting delay circuit 122 removes signal 124 and enables loading of counters 142, 146, and 154, as well as counters within propagation delay 122. Propagation delay 122 then outputs countdown pulses 128 to counters 142 and 146 to reduce the switch input data count 104 by the system propagation delay. Thus, counters 142, 146 will clock to zero with fewer pulses, i.e., faster, than the delay set in input data registers 100.

When the correcting counters within propagation delay 122 are empty, NOR gate 132 provides output signal 134 which provides RESET 320 (FIG. 5) to prevent reset of the synchronizing system. Output 134 also forms PRESET 138 through NOR gate 136. Gate 136 delays PRESET 138 slightly from signal 134 to preset down counter 164 with the contents of conter 146.

Thus, counters 142, 146, and 154 contain data which has been loaded through parallel binary inputs 116, 118, and 120. It will be appreciated that parallel binary inputs 120 are provided from registers 112 to corresponding counters 154 in a conventional manner. Data within counters 142 and 146 are corrected for system internal propagation delay to obtain a set of data in counters 142, 146, and 154 effective to obtain the desired high resolution delay interval between a trigger pulse and an output pulse.

High resolution data in counter 142 are provided as direct binary data 148 to converter 162, which may conveniently be a binary coded decimal-to-decimal converter, to obtain output 188 in decimal form.

The output of counter 146 is further provided as parallel outputs 150 to presettable down counter 164. Down counter 164, as more particularly described in FIG. 6, comprises internal flip-flops to count down from a preset value and to provide countdown pulses 166 to counters 154. Countdown pulses 166 are conveniently scaled down, herein by a factor of five, to enable counters 154 to operate at only a 10 MHz clocking rate.

Countdown pulses 166 count down the array of counters 154. Counters 154 are grouped to provide a plurality of counter output lines 156 to a plurality of counter output logic gates 160, which may conveniently be OR gates. Thus, a series of logic gates are provided which must be satisfied in series to derive logical output signal 170 which indicates that counters 154 are empty. Thereafter, output 172 from down counter 164 is combined with signal 170 through OR gate 174 to obtain an output for input to latch 176 indicative of an elapsed time interval to a resolution of 10 ns.

Latch 176 thereafter generates a first delayed signal 180 to pulse shaper 182 to form an input pulse to a second LCD 184. Latch 176 also provides output 178 which serves as a status signal that a terminal count has been reached and also serves to inhibit clock 32 and 34 throughputs from logic gates 38 and 42, respectively (FIG. 2).

Decimal output taps 188 are provided from converter 162 along with 1 ns output taps from LCD 184 to comparison logic 192, which may conveniently be a plurality of NAND gates. When a logic gate has been satisfied, i.e., a correspondence of outputs from 188 and 190, delayed output signal 196 goes low to enable pulse shaper 198 to generate a second delayed internal output pulse 72 for input to the circuits shown in FIG. 2. The second delayed output pulse 72 is obtained at a time delay corresponding to the time delay input to data registers 100 as corrected for system operation and propagation delays. As explained in connection with FIG. 2, delayed output pulse 72 is thereafter phase shifted for synchronism with respect to input trigger pulse 10, 12, for use in generating the desired delayed output pulse 84.

Figure 4:
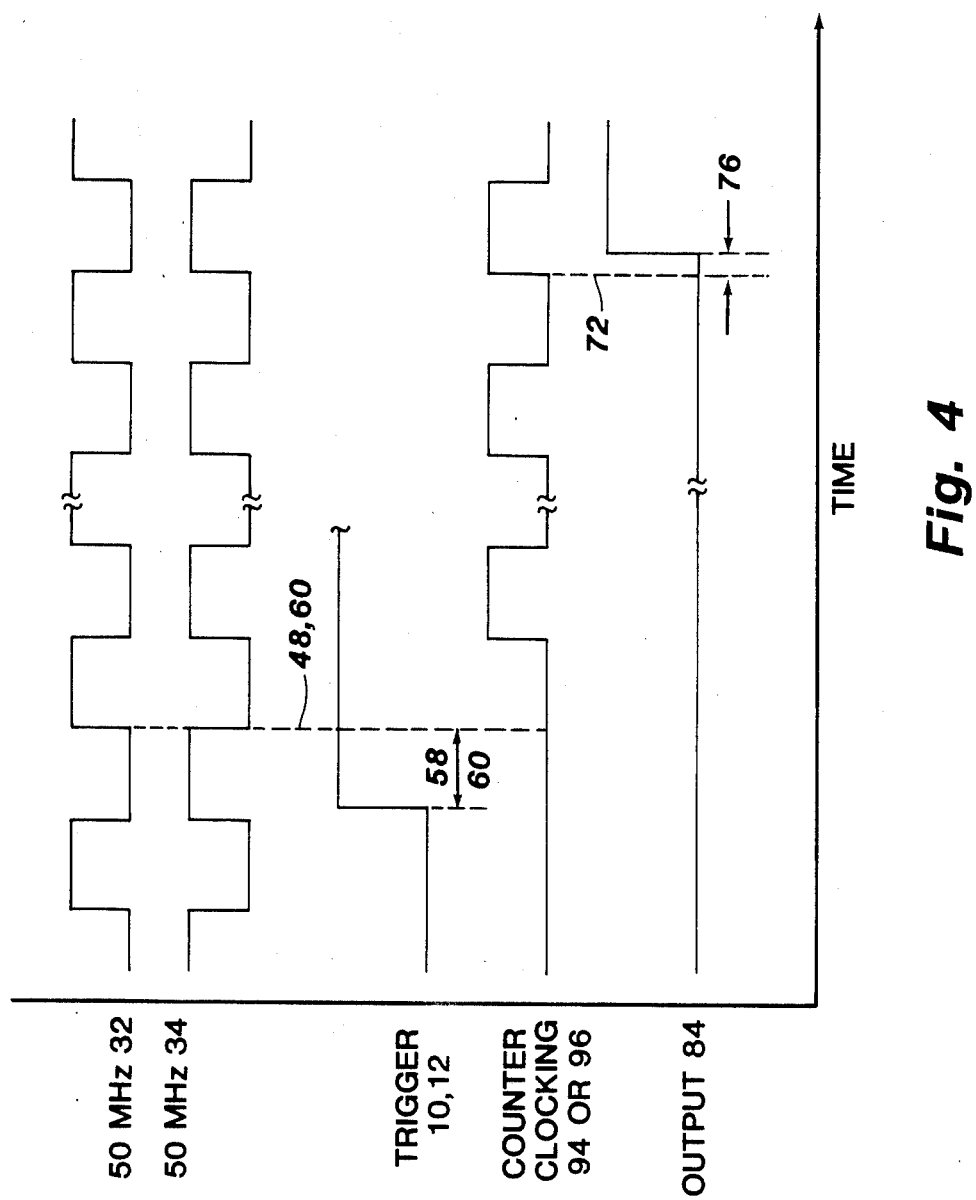
FIG. 4 is a timing diagram illustrating temporal relationships between an incoming trigger pulse, supplied internal clock pulses, high resolution data, and an output pulse having the correct synchronization with the trigger pulse.

FIG. 4 presents a relative timing diagram for generating an output pulse 84 having a high resolution delay interval from a trigger pulse 10 or 12. As illustrated, clocking pulse trains 32 and 34 are provided for internal timing. Trigger pulse 10 or 12 initiates outputs 58, 60 from an LCD. Outputs 58, 60 are latched by a next arriving positive-going pulse edge from pulses 32 or 34 to form a latching pulse edge 48 or 60. Latched event 48 or 60 also logically enables counter clocking pulses 94, 96 to the system counters. Clock pulses 94, 96 thereafter clock the system beginning with the next positive clock edge after latching clock edge 48, 60. Note that if pulse train 34 provides the clocking pulses, and edge, pulse train 34 provides the clocking pulses, and vice versa. Clock pulses 94 or 96 are provided to circuits deriving an internal delayed output pulse 72 which must be synchronized relative to trigger pulse 10, 12. Synchronizing data 76 from a third LCD are output and complemented with data 58, 60 to obtain output pulse 84 which is delayed in synchronism with input trigger 10, 12 by a delay preset to a high resolution, e.g., 1 ns.

By way of example, with reference to FIGS. 2, 3, 4, assume a desired time delay of 105 ns, with a circuit propagation delay of 66 ns. With an internal clock rate of 50 MHz, an internal pulse width of 10 ns is realized. Thus, logic circuit 64 complements delay output 72 with latched synchronizing data 58, 60 on a base of ten. Thus, system delays include the 66 ns propagation delay and 10 ns phasing delay which correct the input delay data 100 stored in counters 108, 110, 112 to leave 20 ns in counters 110 and 112 and 9 ns in counter 108 of the programmable delay. The delay generated by the system is as follows:

| | |
|---|---|
| Main Counter | 20 ns |
| Programmable Delay | 9 ns |
| Propagation Delay | 66 ns |
| Trigger Phase | 8 ns |
| OutPut Phase Added | 2 ns |
| | 105 ns |

While it is believed that the present invention could be practiced by reference to the block diagrams presented in FIGS. 2 and 3, FIGS. 5 and 6 present more detailed schematics illustrating one particular embodiment of the present invention. References are made to conventional components referenced in FIGS. 2 and 3 for low frequency counting without detailed circuit schematics.

Trigger pulses 10-12 are provided to flip-flops 224, 226, respectively, with the input selected by a switch 222. Input flip-flop 224 or 226 turns on driver circuit 228 to provide an input pulse to a first LCD 232. Preferably, LCD 232 has output taps providing signals at 1 ns intervals to latches 236, 238, 240, 242.

The data appearing at the output of LCD 232 is latched upon the next arriving edge of the clock pulses by providing clocking pulses 32 and inverted clocking pulses 34 to alternately latch data within latches 236 and 238 or 240 and 242. The first pair of latched gates provides an output signal to associated logic gates 250, 254 to prevent further latch signals from occurring. The latched output signal is also provided to AND gates 256 and 258 to enable system countdown to begin at the next positive-going pulse edge without waiting an additional full pulse length.

Gates 256 and 258 cooperate with clocking pulses 32 and 34, respectively, to generate countdown pulse trains 262 and 264 beginning with the next pulse train 32, 34 arriving after the latching signal. The output from latches 236, 238, 240, and 242 is provided to NAND gates 268A, B, C, D, E, F, G, H, J, and K. When the logic of a gate is satisfied, the output goes low to forward bias the diodes associated with the satisfied logic gates.

Figure 5:
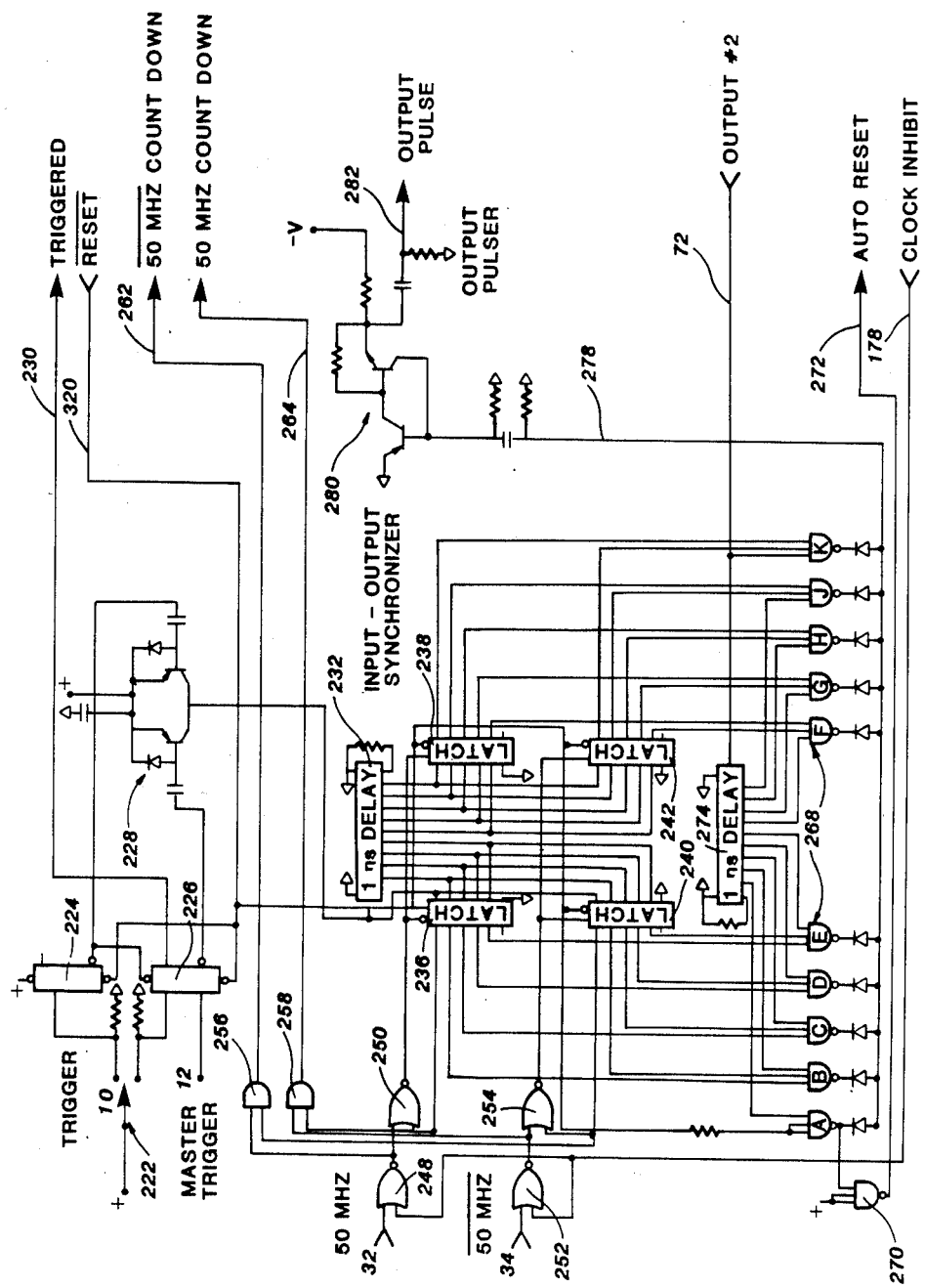
FIG. 5 is a circuit schematic of circuit components for synchronizing output pulse generation with trigger pulse initiation.

It will be seen from FIG. 5 that a second set of gate logic input data is output from LCD 274. LCD 274 is logically connected with outputs complementary with the outputs of LCD 232. Accordingly, output gate logic will be satisfied when the sum of the delay measured by LCD 232 and the output of LCD 274 is one pulse width, or 10 ns, as herein described. Delayed output signal 278 is produced by logic gates 268 with the same timing relative to clocking pulses 32, 34 as arriving trigger pulse 10, 12. Delayed output signal 278 turns on output pulser 280 to generate final output pulse 282. As illustrated in FIG. 5, output pulse 282 is produced with a pulse height useful for activating attached circuitry (not shown).

The circuit depicted in FIG. 5 also provides several housekeeping functions. An output signal from the last tap of LCD 274 combines through NAND gate 268A with an inverted reset signal 320, as described with respect to FIG. 6, to enable NAND gate 270 to output automatic reset signal 272 at the conclusion of the delayed output. Further, clock inhibit signal 178 is input to logic gates 248 and 252 to stop further clocking of the system. Trigger input flip-flops 224, 226 further provide status pulse 230 to indicate that system operation has been triggered.

Figure 6:
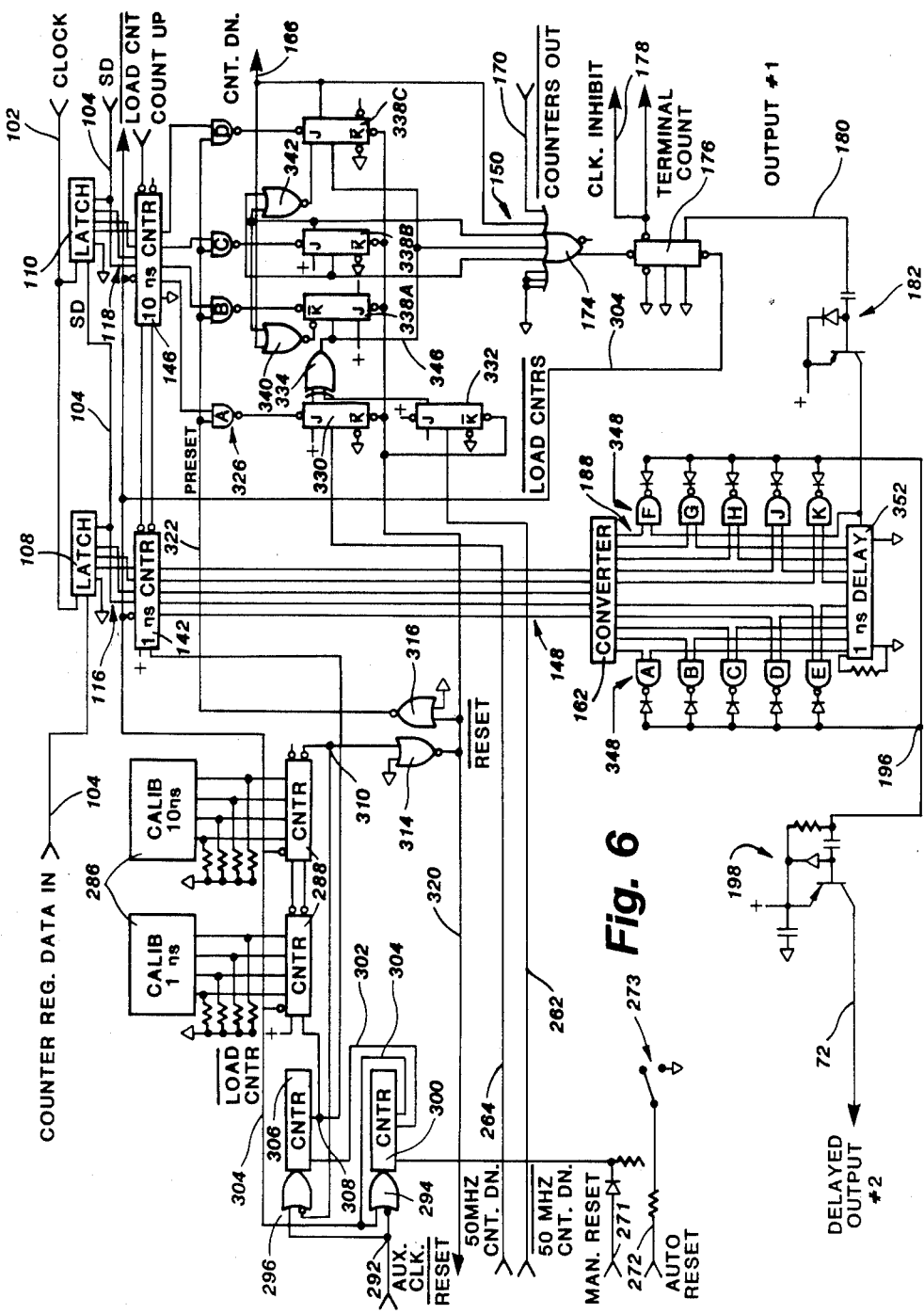
FIG. 6 is a circuit schematic showing circuits for generating an internal pulse having a delayed time interval with high resolution timing.

FIG. 6 now depicts a detailed schematic of a circuit having the primary function of producing second delayed output pulse 72, which is an internal pulse in synchronization with the enabled internal clock pulses 262 or 264, but delayed from the initial countdown pulse 262 or 264 by a time functionally related to the input data in registers 100. As shown in FIGS. 1 and 3, input data may be obtained from data switches 5 which may initially input to data registers 100. It should be again noted that the data in data registers 100 may be manually input through thumb wheel switches or may be input by a computer interface system, not shown herein.

In either event the selected input delay data is loaded into the system as hereinafter described.

Register data (SD) 104 is clocked into registers 108 and 110 by clock pulses 102. As shown in FIG. 3, additional registers 112 are used to accumulate low resolution delay information in excess of the 10 ns data in register 110. Circuits associated with such low resolution data are conventional and are not further described in detail beyond the description of FIG. 3.

When the serial data have been clocked into registers 108, 110, and 112 (FIG. 3), the data must be loaded into counters 142, 146, and 154 (FIG. 3) to enable a delayed signal to be generated. However, it will be recalled that component operating delays and system propagation delays now effect the high resolution delay timing interval. Accordingly, calibration switches 286 are provided to input the results of a system internal delay calibration.

Internal delay data are then provided to counters 288 to correct the preset delay shifted into counters 142 and 146. Auxiliary clock pulse train 292 is provided to OR gates 294 and 296. Gate 294 outputs to counter 300 which acts as a "one-shot" to first output enable signal 304 to load the data counters discussed above and to promptly thereafter reset output 302 to counter 306 for receiving output pulses from OR gate 296. Counter 306 outputs pulse train 308 to countdown calibration counters 288 and also data counters 142 and 146. When calibration counters 288 are empty, output signal 310 terminates calibration counting with signal 310 and acts to produce RESET 320 and, through NOR gate 316, a PRESET signal 322 to preset down counter 164 (FIG. 3).

As hereinabove discussed for FIG. 5, the next arriving system clock pulses 262 or 264 following an LCD 232 data latch are input to J-K flip-flops 330 and 332, respectively, which toggle through exclusive OR gate 334 to count down the associated circuitry. NOR gate 314 has acted to RESET system components, with NOR gate 316 providing PRESET signal 322 at a time thereafter to preset system flip-flops through associated NAND gates 326A, B. C, D. Flip-flops 338A, B, C and associated NOR gates 340 and 342 act as a presettable down counter and further provide output pulses 166 at a lower frequency than the system clocking pulses 262, 264. By way of illustration, output pulses 166 are scaled by a factor of five to a frequency of 10 MHz to count down the system counters beginning with the counter with 100 ns data (see counters 154 in FIG. 3). This relatively low frequency clocking improves system reliability and accuracy. In any event, output pulses 346 from exclusive OR gate 334 serve to clock down counter 164 (FIG. 3).

As described in FIG. 3, countdown pulses 166 are generated to clock out the low resolution data until the low resolution counters are empty and the associated logic gates are satisfied. Logic output 170 is indicative of the completion of low resolution counting. Output 170 and outputs 150 from downcounter 164 are provided to logic gate 174. When the input satisfies logic gate 174, an output from gate 174 sets latch 176, indicating that low resolution delay clocking has been completed. Latch 176 provides status signal output 178 indicating a terminal count and inhibiting input clock logic gates 248 and 252 (see FIG. 5).

The high resolution data in counter 142 are presented in binary coded decimal form on signal lines 148 to converter 162, having decimal outputs 188. Decimal outputs 188 from converter 162 and NAND gates 348A, B, C, D, E, F, G, H, J, and K cooperate with second LCD 352 to provide the high resolution component of the preset delay. A first delayed internal pulse 180 is provided through pulse shaper 182 to second LCD 352 with output taps logically connected to associated NAND gates 348A, B, C, D, E, F, G, H, J, K, in correspondence with the preset output generated from converter 162. When a gate logic is satisfied, the associated output will go low to forward bias the connected diode for outputting delayed signal 196, which turns on pulse shaper 198. Pulse shaper 198 generates second internal delayed output pulse 72, which is then synchronized with the incoming trigger pulse to form an output pulse, as hereinabove described in FIG. 5.

At the end of output pulse generation the system may be reset, either manually or automatically. As discussed for FIG. 5, an automatic reset pulse 272 is generated by the synchronizing logic 268A. If an automatic reset is not desired, switch 273 may be moved to ground automatic reset signal 272, enabling manual reset signal 271 to input counter 300 to reset system components.

In the circuits herein described, output data with the desired 1 ns resolution are provided from LCD components 232, 274, 352. Each LCD is preferably obtained from Automatic Coil Company as component CD-301 C-199.

The foregoing description of the preferred embodiment of the invention has been presented for purposes of illustration and description. It is not intended to be exhaustive or to limit the invention to the precise form disclosed, and obviously many modifications and variations are possible in light of the above teaching. The embodiment was chosen and described in order to best explain the priciples of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A high resolution delay timer for generating an output pulse following a trigger pulse at a time delay interval preset with a resolution which is high relative to a low resolution available from supplied clock pulses, comprising:

first lumped constant delay means for inputting said trigger pulse and generating a first output signal at predetermined interpolation intervals corresponding to said high resolution;

first latch means in series connection with said first lumped constant delay means for detecting edges of said supplied clock pulse and latching said first output signal in response to a first one of said edges after said trigger pulse to form first high resolution synchronizing delay data;

input means for presetting a selected time delay interval with a first timing portion having a relatively low resolution and with a second timing portion having said high resolution;

timer means in series with said input means and including counter means responsive to said first timing portion for relatively low resolution timing and second lumped constant delay means responsive to said second timing portion for timing at said high resolution wherein an internal pulse is generated at a delay temporally related to said preset time interval;

circuit means in series with said timer means and receiving said internal pulse for initiating generation of second high resolution synchronizing delay data; and logic circuit means connected to receive said first and second synchronizing delay data in parallel for logically combining said first and second delay data and generating said output pulse synchronized with said trigger pulse and delayed by said preset high resolution time delay interval.

2. A delay timer according to claim 1, wherein said timer means further includes:

means for clocking down said counter means;

logic means for generating an input pulse for said second lumped constant delay means when said counter means count down to a preset value; and comparison means for generating said internal pulse when said second lumped constant delay generates a high resolution output at a time functionally related to a high resolution portion of said preset time interval.

3. A delay timer according to claim 1, wherein said timer means further includes:

correcting means for adjusting said preset time interval for signal propagation delays within said delay timer.

4. A delay timer according to claim 1, wherein said logic circuit means includes a plurality of gates connecting said first synchronizing delay data signal complementary with said second synchronizing delay data signal to derive said output pulse at a same relative timing with said clock pulse as said trigger pulse.

5. A delay timer according to claim 1, wherein said circuit means in series with said timer means further includes:

a third lumped constant delay means receiving said internal pulse and outputting said second synchronizing delay data signal with interpolating intervals corresponding to said high resolution.

6. A delay timer according to claim 5, wherein said logic circuit means includes:

a plurality of gates having an output corresponding to concurrence of said first synchronizing delay data signal and said second synchronizing delay data signal, said second delay signal being the complement of said first delay signal.

7. A delay timer according to claim 6, further including:
a pulse generator receiving said output of said gates; and
said gates comprising NAND circuits for forward biasing said pulse generator on said concurrence of said first and second synchronizing delay data signals.

8. A method for generating an output pulse following a trigger pulse at a temporal delay determined by an interval preset with a resolution which is high relative to a low resolution available from supplied clock pulses, comprising the steps of:
producing a first output signal from a first lumped constant delay means providing outputs at interpolation intervals with said high resolution during one period of said supplied internal clock pulses following input of said trigger pulse;
latching said first output signal when an edge of said supplied clock pulse is detected to form first high resolution synchronizing delay data;
presetting internal counters with a time delay interval having a first timing portion with a relatively low resolution and a second timing portion with said high resolution;
counting said supplied internal clock pulses following said detected edge to generate a low resolution count;
generating an internal pulse when said low resolution count is functionally equivalent to said first timing portion;
inputting said internal pulse to a second lumped constant delay means to output said internal pulse at said high resolution interpolation intervals;
logically comparing said internal pulse interpolations with said second timing portion to output a delayed internal pulse on the occurence of a predetermined comparison;
inputting said delayed internal pulse to synchronizing circuit means to generate second high resolution synchronizing delay data in response to said delayed internal pulse;
inputting said first and second synchronizing delay data to logic circuit means; and
deriving in said logic circuit means said output pulse synchronized with said trigger pulse and delayed by said preset high resolution time delay interval.

9. A method according to claim 8, wherein said step of generating said internal pulse further includes:
clocking down said internal counters;
logically generating an input pulse for said second lumped constant delay to output a series of high resolution intervals when said counter means counts down to a preset value; and
generating said internal pulse when said high resolution output intervals correspond to said second timing portion of said preset time interval.

10. A method according to claim 8, further comprises the steps of:
correcting said preset time interval for signal propagation delays in said step of generating said internal pulse.

11. A method according to claim 8, wherein said step of inputting said first and second synchronizing delay data further includes the steps of:
complementing said first synchronizing delay data with said second synchronizing delay data through a plurality of logic gates for deriving said output pulse at a same relative timing with said clock pulse as said trigger pulse.

12. A method according to claim 8, wherein said step of generating said second synchronizing delay data further includes:
inputting said internal pulse to a third lumped constant delay; and
outputting said second synchronizing delay data signal with interpolating intervals corresponding to said high resolution and complementary to said first synchronizing delay data.

13. A method according to claim 12, wherein said step of deriving said output pulse comprises the step of:
generating an output signal corresponding to concurrence of said first synchronizing delay data signal and said complementary second synchronizing delay data.

14. A method according to claim 13, further including:
generating in a pulse generator a pulse responsive to said output pulse of said logic circuit means,
said logic circuit means comprising NAND circuits for forward biasing said pulse generator on said concurrence of said first and second complementary synchronizing delay data.

* * * * *